United States Patent [19]

Zupancic et al.

[11] Patent Number: 5,139,880
[45] Date of Patent: Aug. 18, 1992

[54] PHOTODEFINABLE INTERLEVEL DIELECTRICS

[75] Inventors: Joseph J. Zupancic, Bensenville, Ill.; Daniel C. Blazej, Annandale; Howard A. Fraenkel, Lebanon, both of N.J.

[73] Assignee: Allied-Signal Inc., Morris Township, Morris County, N.J.

[21] Appl. No.: 629,514

[22] Filed: Dec. 18, 1990

[51] Int. Cl.$^5$ .................... B32B 15/08; B44C 1/22
[52] U.S. Cl. .................... 428/457; 156/655; 156/659.1; 156/904; 427/43.1; 427/44; 427/58; 427/385.5
[58] Field of Search .................... 526/247; 522/166; 156/655, 659.1, 904; 428/457; 427/58, 43.1, 44, 385.5

[56] References Cited

U.S. PATENT DOCUMENTS

| | | | |
|---|---|---|---|
| 4,816,498 | 3/1989 | Zupancic et al. | 522/166 |
| 4,855,375 | 8/1989 | Zupancic et al. | 526/247 |
| 4,908,096 | 3/1990 | Zupancic | 156/655 |

*Primary Examiner*—Thomas J. Herbert, Jr.
*Attorney, Agent, or Firm*—Harold N. Wells; Gerhard H. Fuchs; Mary Jo Boldingh

[57] ABSTRACT

A predetermined pattern of a dielectric polymer is formed on a substrate from a mixture of prepolymers which are the ethers of the oligomeric condensation product of (a) dihydric phenol and formaldehyde and (b) a dialdehyde and 3 to 4 moles of a phenol.

24 Claims, No Drawings

PHOTODEFINABLE INTERLEVEL DIELECTRICS

The U.S. Government has rights in this invention under U.S. Air Force Contract F33615-89-C-5603.

PRIOR ART

This invention relates to materials used to provide isolation of conductive layers in microelectronic circuitry. In particular, it relates to polymeric materials which can be photopolymerized so that dielectric layers can be formed where desired in multilayer structures. Such layers must be excellent insulators, have good chemical resistance and, of course, must adhere to the substrate on which they are placed.

Polyimides have been used for such dielectrics since they have superior temperature and chemical resistance compared to many other polymers. Literature and patents disclosing of the use of polyimides are extensively discussed in U.S. Pat. No. 4,908,096 by one of the present inventors and incorporated herein by reference. The disadvantages of the polyimides are discussed, namely, that they release large amounts of volatiles during curing, absorb moisture, have poor adhesion, and have a relatively high coefficient of expansion. The patent discloses and claims the use of other polymers as interlevel dielectrics having improved properties, namely, vinylbenzyl or alkyl ethers of the condensation products of dialdehydes and phenols.

The present invention relates to other polymers which have been found to provide useful interlevel dielectrics.

In U.S. Pat. No. 4,855,375 one of the present inventors has disclosed oligomers which are ethers of bisphenols and formaldehyde which may be fluorinated and which have application to making laminated boards for electronic applications. The patent is incorporated by reference herein. In U.S. Pat. No. 4,816,498, incorporated by reference herein, another family of oligomeric condensation products was disclosed which differ from those just discussed in being the condensation products of dialdehydes with 3 to 4 moles of phenols. Such oligomers also are etherified to provide a mixture of vinylbenzyl and alkyl ethers. They may be used to make laminated boards for electronic applications. Such polymers now have been found to be useful as interlevel dielectrics, as will be seen in the discussion below.

SUMMARY OF THE INVENTION

This invention comprises a method of forming a predetermined pattern from a polymer on a substrate and the thus-created dielectric layers.

Such patterns are created by coating onto the substrate a prepolymer and then irradiating the exposed portions of a masking pattern to render the prepolymer insoluble, then selectively dissolving the non-irradiated masked portions of the coating leaving the insoluble irradiated prepolymer, and curing the irradiated prepolymer to form an infusible glassy solid in the predetermined pattern.

The prepolymer is a mixture of two oligomers. One is an ether of the oligomeric condensation product of a dihydric phenol and formaldehyde having the formula

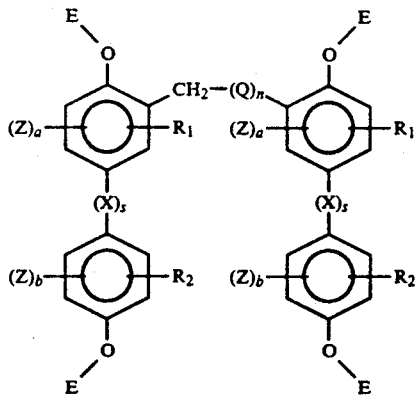

where the recurring unit Q has the structure,

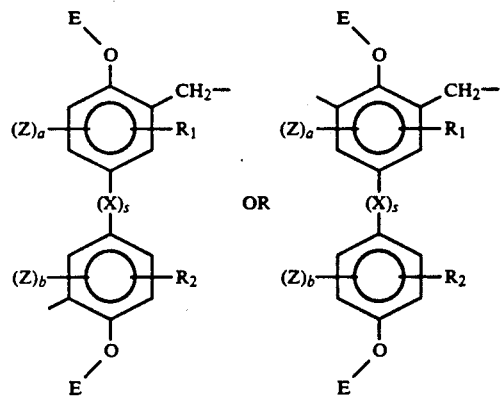

and
n is an integer from 1 to 10;
s is 1;
each X is

each $R_1$ and $R_2$ is independently selected from the group consisting of hydrogen, alkyl and alkoxy moieties containing 1 to 10 carbon atoms, phenyl and phenoxy;
a and b are independently 0 or integers from 1 to 4;
Z is Cl or Br;
E is selected from the group consisting of the vinylbenzyl moiety, alkyl moieties containing 1 to 10 carbon atoms, and benzyl, subject to the constraint that at least 50% of all E's are the vinylbenzyl moiety.

In a preferred embodiment, E is at least 70% vinyl benzyl and the remaining E's are propyl.

The second oligomer is an ether of the oligomeric condensation product of (a) molar proportion of a dialdehyde and (b) from about 3 to about 4 molar proportions of a phenol; where the dialdehyde is selected from the group consisting of $OHC(CH_2)_mCHO$, where $m=0$ or an integer from 1 to 6, cyclopentanedialdehyde, phthalaldehyde, isophthalaldehyde, terephthalaldehyde, hexahydrophthalaldehyde, cycloheptanedialdehyde, hexahydroisophthalaldehyde, hexahydroterephthalaldehyde, and cyclooctanedialdehyde; where the phenol has the structure $R_3C_6H_4OH$ and where $R_3$ is hydrogen or an alkyl group containing from 1 to about 10 carbon atoms; and where the phenol residue of said oligomeric condensation product is etherified with one or more substituents to afford ether moieties randomly selected from the group consisting of vinylbenzyl, alkyl moieties containing from 1 to 10 carbon atoms, cycloalkyl moieties from 5 to 10 carbon atoms, and benzyl, with the ratio of vinylbenzyl to other moieties being from 1:1 to about 6:1.

DESCRIPTION OF THE PREFERRED EMBODIMENTS

Polymeric Resins

In U.S. Pat. No. 4,855,375, one of the present inventors disclosed the preparation and use of the ethers of the oligomeric condensation products of a dihydric phenol and formaldehyde and their use in composites, especially laminated boards for electronic uses. It has now been found that these compositions can be used as interlevel dielectrics in combination with the oligomers of U.S. Pat. No. 4,816,498, where they have the advantages of low water absorption, low dielectric constant, low coefficients of thermal expansion, high glass transition temperature, high thermal stability, high solids coating concentrations, and are photochemically curable, thermally curable, and generate little or no volatiles during the cure process.

The prepolymers used in forming a pattern are of two types. The first has the formula:

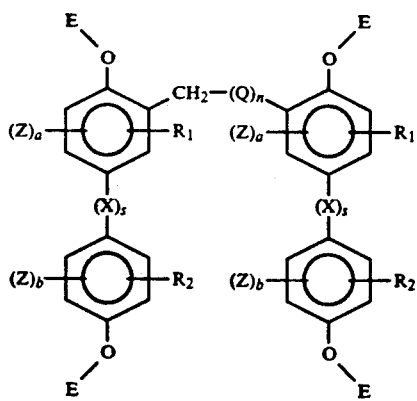

They result from the etherification of oligomers which are the condensation product of a dihydric phenol and formaldehyde. The product will be a mixture of oligomers with varying molecular weight. The number, n, of recurring units Q generally will vary from 1 to 10. Preferably, n is 1 or an integer from 1 to 6 and the number average of n is about 3.

The recurring unit Q itself has the structure,

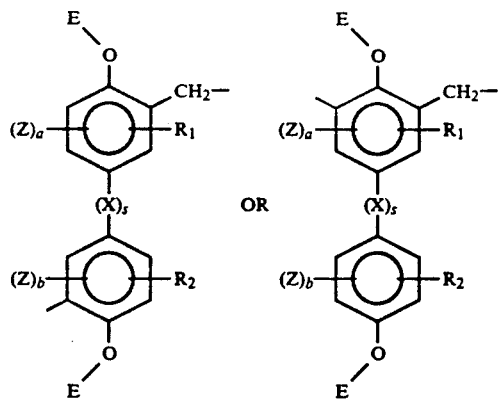

Note that the condensation may occur either on the same ring, as in the right hand structure, or in different rings, as in the left hand structure. The aromatic rings in the recurring unit Q are separated by an intervening moiety X, that is, S is 1. Each of the moieties X is hexafluoro isopropylidene

Each of the aromatic rings may bear substituents or may be completely unsubstituted. Thus, $R_1$ and $R_2$ are independently selected from moieties such as hydrogen, alkyl moieties containing from 1 to 10 carbon atoms, the phenyl moiety, alkoxy moieties containing from 1 to 10 carbon atoms, and phenoxy, $C_6H_5O$. Examples of suitable alkyl moieties include methyl, ethyl, propyl, butyl, pentyl, hexyl, heptl, octyl, nonyl, and decyl moieties. The methyl and tert-butyl groups are preferred alkyl moieties, although the variant where $R=R_2=H$ is quite desirable.

The basic resins can be modified to be flame retardant by incorporating halogen atoms into the aromatic rings. Thus, Z may be a halogen atom, especially bromine, and where the aromatic ring is halogenated a and b are integers from to 1 to 4. Polyhalogenated materials are preferred as flame retardants, and thus a and b are recommended to be 2, 3, or 4.

The oligomeric condensation products have a multiplicity of phenolic hydroxyl groups substantially all of which are end-capped as ether groups in our interlevel dielectric resins. The best case results where the ether portion, E, is a vinylbenzyl moiety, that is, of the structure.

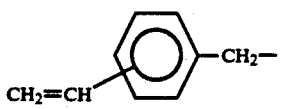

which may be either the meta- or para-isomer, and which usually is a mixture of the meta- and para-isomers. Although it is desirable to have all the phenolic hydroxyls end-capped with vinylbenzyl moieties, there is a cost advantage when fewer than all of the ether groups are vinylbenzyl, but usually at the expense of a somewhat lower dielectric constant. At least 50% of the E moieties should be a vinylbenzyl moiety, but better performance characteristics result when from 70 to 100% of the ether groups are vinylbenzyl, and the best prepolymer product results when 95 to 100% of such groups are vinylbenzyl. However, for many applications less than complete end-capping with vinyl benzyl groups is acceptable, but all of the hydroxyl groups should be capped.

Where the ether groups include other than vinylbenzyl, then E is an alkyl group containing from 1 to 10 carbons or a benzyl group. Where E is an alkyl group, the primary alkyl groups are preferred, especially the primary lower alkyl groups containing from 1 to 4 carbon atoms. Thus, the most desirable alkyl groups consist of methyl, ethyl, 1-propyl, 1-butyl, and 1-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl, 2,3-dimethyl-1-butyl, 3,3-dimethyl-1-butyl, 2-methyl-1-pentyl, and so forth.

In a preferred embodiment E is at least 70% vinyl benzyl and the remaining E's are propyl.

The second type of oligomers are ethers of oligomeric condensation products of 1 molar proportion of certain dialdehydes with from about 3 to about 4 molar proportions of a phenol. More particularly, the ether moiety is randomly selected from among the vinylbenzyl moiety, alkyl moieties containing from 1 to 10 carbon atoms, cycloalkyl moieties having from 5 to about 10 carbon atoms, and the benzyl moiety, where the ratio of the vinylbenzyl to other ether moieties is at least 1:1 and may be as great as 6:1.

The phenolic oligomers are the condensation products of 1 molar proportions of selected dialdehydes with 3 to 4 molar proportions of a phenol. Although more than 4 molar proportions of a phenol can be used in the practice of this invention, no more than 4 molar proportions will react with the dialdehydes.

On class of dialdehydes which may be used in this invention are the linear, terminal alkylene dialdehydes of formula $OHC(CH_2)_mCHO$ where m is 0 or an integer from 1 to 6. Such dialdehydes include glyoxal, malondialdehyde, succinidialdehyde, glutaraldehyde, adiphaldehyde, pimelaldehyde, and sebacaldehyde. Those aldehydes where m is 0–4 are particularly preferred, and glyoxal (m=0) is especially favored in the practice of this invention.

Other aldehydes which may be employed in preparation of the oligomeric condensation products include cyclopentanedialdehyde, phthalaldehyde, isophthaldehyde, terephthalaldehyde, the hexahydrophthalaldehydes (i.e., the reduced counterpart of the phthalaldehydes where the aromatic ring has been reduced to a cyclohexane ring), cycloheptanedialdehyde, and cyclooctanedialdehyde.

The oligomers are the condensation product of 1 molar proportion of the aforementioned dialdehydes with from 3 to about 4 molar proportions of a phenol. The phenol has the general structure $R_3C_6H_4OH$ where $R_3$ is hydrogen or an alkyl group containing from 1 through about 8 carbon atoms. The most desirable phenol is phenol itself, that is, the case where $R_3$ is hydrogen. Where $R_3$ is an alkyl group it is most desirable that the alkyl group contain from 1 to about 4 carbon atoms, and cresol, the case where $R_3$ is a methyl group is another preferred species of phenol.

The condensation product is analogous to phenol-formaldehyde resins. That is, the products result from the condensation of 2 molar proportions of a phenol with each aldehyde group. In the simplest case, which can be looked as the "monomeric" product, using phenol and glyoxal to exemplify the reaction, the product has the structure

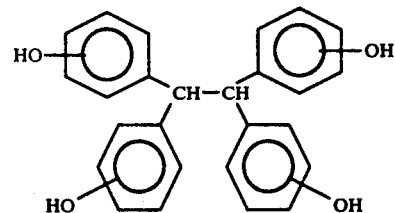

where the hydroxyls are almost exclusively ortho and para, and largely para, to the point of condensation of the phenol and glyoxal. However, the product above has 4 phenolic groups per molecule, and any one of these may react with another molecule of glyoxal which then further condenses with three other molecules of phenol to give the structure

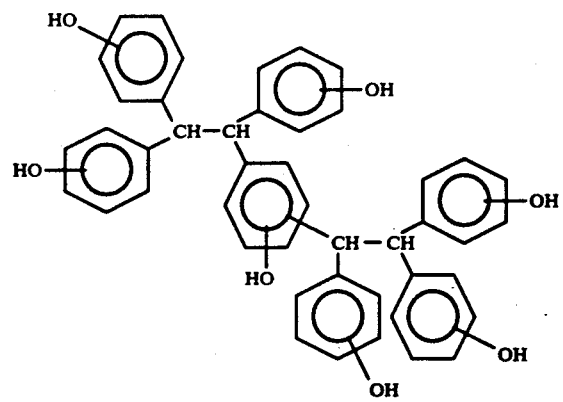

The oligomeric product above results from a molar proportion of 7 phenols to 2 glyoxals. This oligomer in turn can react with another molecule of glyoxal and the latter can react further with 3 additional phenols to give the next higher oligomer of the structure

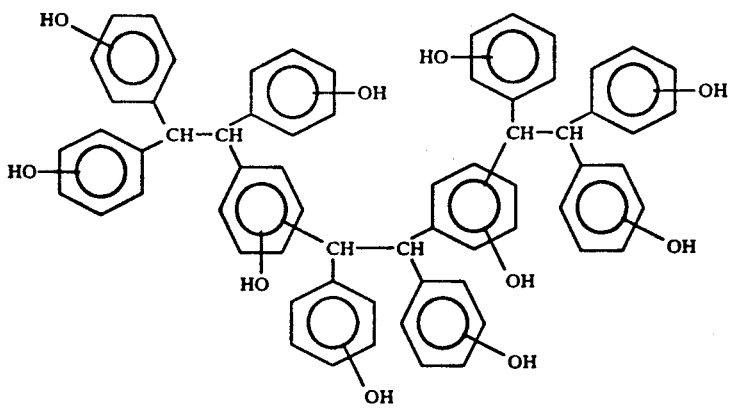

which has the molar ratio of 10 phenolic groups to 3 glyoxals. In a similar fashion, the next higher oligomer has a molar ratio of phenol to glyoxal of 13:4, the next higher of 16:5, and so forth, with the limiting molar ratio being 3:1. It needs to be mentioned that a ratio less than 3:1 will never be achieved without internal cyclization, i.e., one molecule of glyoxal is required to react with at least 2 phenolic moieties of the oligomer. In a similar fashion, the condensation product which is the "monomer" has a limiting ratio of phenol-glyoxal of 4:1.

The condensation products are themselves phenols, as mentioned above, and are a mixture of oligomers. This mixture can be characterized by the number of phenolic moieties per molecule. We are concerned with those condensation products which have from 4 to about 60 phenolic moieties per molecule, and more usually between four and about 22 phenolic moieties per molecule. The product being a mixture of oligomers, the preferred mixture is characterized by having as an average between about 5 and about 8 phenolic moieties per molecule.

More specifically, where the dialdehyde is glyoxal and the phenol is phenol itself each oligomeric product has a molecular weight between about 400 and 6000, and more desirably between about 400 and about 2200. The mixture of oligomeric products may be characterized by an average molecular weight of between about 500 and about 800.

The thermosetting resins of this invention are ethers of the aforedescribed oligomeric condensation products. In one variant of our invention the phenolic condensation products are halogenated prior to ether formation in order to make the final resins more flame retardant. Increased flame retardancy occurs especially when the halogen is chlorine or bromine, and the use of a brominated product is preferred. The halogen is introduced into positions ortho and para to the phenolic hydroxyl group. If all of the ortho and para positions are available a maximum of three halogen atoms per phenolic moiety may be introduced. Often it is desirable to prepare the maximally halogenated oligomeric condensation product, although at times a halogen content less than the maximum is advantageous. However, in the latter variant it should be clear that there is at least one chlorine or bromine atom per phenolic moiety. The phenolic condensation products are capped so as to convert substantially all (greater than about 99.5%) of the hydroxyls to ether moieties. Each of the ether moieties is randomly selected from the group consisting of vinylbenzyl, alkyl containing 1 to 10 carbon atoms, cycloalkyl of from 5 to 10 carbon atoms, and benzyl moieties as described above with respect to the first type of oligomer where the ratio of the vinylbenzyl to all other ether moieties is at least 1:1 and may be as high as 6:1.

The prepolymers may be prepared by acid catalyzed condensation of dihydric phenols with formaldehyde followed by end-capping substantially all the phenolic hydroxyls by converting them to ethers. Acid catalyzed condensation is preferred to avoid the formation of terminal hydroxyl methylene groups, —CH$_2$OH. End-capping by ether formation can be effected by any suitable means, such as by reacting the phenolic condensation product with an alkyl or benzyl halide in a basic medium.

The resulting thermosetting oligomers may be polymerized with attendant crosslinking by a variety of curing means. When curing is effected by thermal means, it generally is autoinitiated by heating the oligomer resin in air or an inert atmosphere at a temperature between about 100° and 300° C., and more particularly between about 120° and 300° C. Curing also may be brought about by chemical means using a free radical initiator such as azo-bis-isobutyronitrile, benzoyl peroxide, di-t-butyl peroxide, etc. In the present invention curing is begun by irradiation, especially by visible and ultraviolet light in the presence or absence of a sensitizer or photoinitiator, followed by thermal curing to produce an infusible, insoluble glassy solid.

PHOTODEFINABLE APPLICATIONS

The oligomers may be used as a passivant, as an interlevel dielectric, as a means of providing device deep dielectric isolation (insulator isolating trenches), as a high temperature solder mask, a photoresist, etc. Although much of what follows describes its use primarily as an interlevel dielectric, the skilled worker will recognize from this description how to use the materials of the invention in other applications as well.

The oligomers are applied as a coating to a suitable substrate. Preferably, the coating will have a thickness of 2 to 15 μm, most preferably 5 to 10 μm. For the most part the substrates used will be a silicon wafer, a silicon chip of an integrated circuit, a printed circuit board or a ceramic substrate. The photosensitive oligomers may be applied by spin coating, spray coating, by use of a doctor knife, or any other conventional techniques known in the art to obtain a uniform coating. Where the viscosity is too high, a solution of the resin in a suitable solvent may be used. The oligomers are soluble in a broad class of solvents including polar aprotic solvents, aromatic hydrocarbons, halogenated hydrocarbons, ketones, ester, and so forth. Examples of solvents which may be employed in the practice of our invention include dimethylformamide (DMF), hexamethylphosphoramide (HMPA), N-methylacetamide (NMAc), dimethylsulfoxide (DMSO), N-methylpyrrolidone (NMP), benzene, toluene, xylene, dichloromethane, chloroform, carbon tetrachloride, chlorobenzene, tetrachloroethane, tetrachloroethylene, trichloroethane, gamma-butyrolactone, methyl ethyl ketone, diethyl ketone, hexanone, heptanone, octanone, methyl acetate, ethyl acetate, methoxy ethanol, ethoxy ethanol, and so forth. The solvent should be unreactive with both the substrate and the photosensitive oligomers and able to dissolve the resins to provide at least about a 10 weight-volume percent solution. Since the solvent is typically removed prior to further processing, it is also preferable that as low boiling a solvent as possible be used consistent with the foregoing considerations.

Although the oligomers may be photopolymerized directly, a photosensitizer or photoinitiator may be used and may be useful to decrease irradiation time. Where a photosensitizer or photoinitiator is used it will be added with the oligomers at the coating stage and will be present in an amount from about 0.001 to about 5.0 weight percent relative to the oligomers. Examples of photosensitizers or photoinitiators which may be successively used in the practice of this invention include such materials as benzophenone, 4,4'-bis(dimethylamino)benzophenone, xanthone, acetophenone, 4-trifluoromethyl-acetophenone, triphenylene, thioxanthone, anthraquinone, 4-phenylbenzophenone, naphthalene, 2-acetonaphthalene, 1-acetonaphthalene, chrysene, anthracene, 9,10-dichloroanthracene, pyrene, triphenylene, 1-fluoronaphthalene, 1-chloronaphthalene, 1-bromonaphthalene, 1-iodonaphthalene, 1,3-dicyanobenzene, dimethyl isophthalate, diethyl isophthalate, methyl 3-cyano-benzoate, ethyl 3-cyanobenzoate, phenyl 3-cyano-benzoate, 2,2-dimethoxyacetophenone, 2,2-diethoxyacetophenone, 2,2'-dimethoxy-2-phenylacetophenone, 2,2'-diethoxy-2-phenylacetophenone, benzoin methyl ether, and 1-phenyl-1,2-propanedione-2-O-benzoyloxime. Preferred sensitizers include benzophenone, 4,4'-bis(dimethylamino)benzophenone, 1,3-dicyanobenzene, dimethyl isophthalate, diethyl isophthalate, methyl 3-cyano-benzoate, and phenyl 3-cyano-benzoate.

Where the photosensitive oligomers have been applied as a solution to the substrate the solvent used must be removed prior to irradiation. Consequently, it is conventional to heat the coated substrate for a time sufficient to remove essentially all of the solvent present, if any, prior to irradiation, a stage known as the "softbake." It is for this reason that the use of a low boiling solvent is preferred. It is acceptable to use enough heat to provide a semicured coating, especially since the oligomers may begin to cure at temperatures as low as about 110° C. The softbake can be carried out in vacuum, under an inert atmosphere (e.g., nitrogen, helium, argon, etc.) or in air.

A mask containing the desired pattern or image is placed in contact or in proximity to the coated substrate and the oligomeric coating is then irradiated through the mask by x-ray, electron beam, ion beam, ultraviolet, or visible radiation. For reasons of economy and ease of fabrication it is preferred to use radiation in the range from about 200 to about 800 nanometers. Since lower wave length radiation tends to afford better resolution, irradiation in the 200-500 nm range is preferred. With this treatment the irradiated portion of the coating becomes crosslinked so that the photocrosslinked oligomer is rather insoluble in the same solvent in which the original photosensitive oligomers remain quite soluble.

Irradiation may be done in either the presence or absence of oxygen. Exposure time necessary for adequate photocrosslinking to afford the differential solubility characteristic sought depends upon the wavelength of the light used, its intensity, the presence or absence of a photosensitizer or photoinitiator, and so forth, with a variation from a few seconds up through several minutes. For production purposes the shorter exposure times are highly preferred. One desirable characteristic of the photosensitive oligomers of this invention is that they photochemically crosslink throughout the thickness of the film. Therefore, the pattern shows no or minimal undercutting upon development.

The selective pattern appears upon development with the solvent. As mentioned above, upon irradiation the photosensitive oligomeric resin becomes extensively crosslinked with a subsequent large differential solubility between the crosslinked, or irradiated, and non-crosslinked, or non-irradiated, portions of the oligomers. The solvents used in the development are in general the same ones used in preparing a solution of the oligomers for coating purposes. Thus, classes of solvents include aprotic solvents, aromatic hydrocarbons, halogenated hydrocarbons, ketones, esters, the Carbitols, mixed solvent systems, and the like.

Upon development selective patterns appear where the elevated portions correspond to the photochemically crosslinked oligomers. These relief structures are then thermally cured to afford a highly crosslinked, infusible, glassy solid highly resistant to elevated temperatures, chemical degradation, ion transport, and which serves as an effective protective layer and dielectric insulator. Curing is attended by crosslinking of the vinyl groups and may be effected either thermally, chemically, or photochemically, with thermal curing preferred. Thermal curing is generally done in the temperature range between about 100° C. and about 300° C., and often is done in stages. So, for example, curing may first be effected at a temperature between about 150° C. and about 200° C. for 0.5-5 hours with postcuring at about 180° C.-300° C. for about 0.5-24 hours. Curing also may be brought about using a free radical initiator, such as azo-bis-isobutyronitrile, benzoyl peroxide, di-t-butylperoxide, and so on.

The oligomers of the invention have been found particularly useful in photodefinable applications since they may be coated as solutions with high solids levels and thus less solvent must be evaporated. Also, since no volatile by-products are generated during curing the shrinkage of the films is minimized.

MULTILAYER PROCESSING

The substrate (i.e., ceramic, alumina, silicon, printed wiring board, etc.) may be cleaned with conventional cleaning solvents (e.g., methylene chloride, chloroform, Genesolv ®, trichloroethylene, ethanol, methanol, sodium bisulfite, sodium sulfite, potassium sulfite, etc.) employing normal cleaning processes as known in the art. In addition, the substrate may contain circuitry already deposited upon it. The substrate may be utilized after the cleaning process or may be surface treated to promote adhesion between the substrate and the metals and/or polymer dielectric layer.

If used, an adhesion promoter between the substrate and the dielectric layer may be chosen from a range of surface silylating agents containing reactive groups capable of reacting with the polymers of the invention. Examples of surface silylating agents which can be employed are: vinylmethyldimethoxysilane, vinyltrimethoxysilane, vinylmethyldiethoxysilane, vinyltriethoxysilane diethoxymethylvinylphenethylsilane, dimethoxymethylvinylphenethylsilane, triethoxyvinylphenethylsilane, trimethoxyvinylphenethylsilane, etc. Preferred silylating agents are vinyl methyldimethoxysilane, vinylmethyldiethoxysilane, diethoxymethylvinylphenethylsilane, and dimethoxymethylvinylphenethysilane. The surface silylating agent would be applied to the substrate via dipping, spin coating, or other techniques from an alcohol-water solution. For example, a 1 to 10 wt. % solution of the silylating agent is dissolved in 85 to 98 wt. % of alcohol (e.g., methanol, ethanol, isopropanol, etc.) and 1 to 13 wt. % of water. The substrate is dipped in this solution for 15 seconds to 5 minutes, air dried for 1 minute to 5 hours, and then soft baked for 1 minute to 5 hours at 60° to 100° C. either in a convection oven, vacuum oven or hot plate.

The cleaned and/or surface treated substrate will be covered with a metal pattern before being covered with the dielectric layer of the invention. For example, a 500 to 1000 Å layer of chromium, 8000 to 20000Å layer of copper and a 500 to 1000 Å layer of chromium may be sputtered onto the surface. Then, the metal layer is coated with a commercial photoresist and processed according to the recommended processing scheme utilizing a spin coat, soft bake, imaging, developing, and hard bake cycle. This exposes portions of the metal layer to be removed by etching to create the pattern. The metals are etched utilizing standard wet techniques, for example: The top chromium layer is etched with a 1 to 30% hydrochloric acid solution activated with aluminum for 10 seconds to 5 minutes; the copper layer is etched with a sodium persulfate solution for 10 seconds to 10 minutes; the bottom chromium layer is etched with a 1 to 30% hydrochloric acid solution activated with aluminum for 10 seconds to 5 minutes; and finally the etched substrate is washed with deionized water for 10 to 60 seconds. Then the remaining photoresist is stripped from the metal pattern as per the processing technique recommended for the photoresist. Finally the cleaned substrate is dried prior to the next processing step.

The dielectric layer is coated onto the substrate and its metal pattern and processed as follows: The prepolymer (e.g., 10 to 80 wt. %) in an appropriate solvent (toluene, NMP, DMF, etc.) is spin coated onto the substrate at a speed of 500 to 2500 rpm for 30 to 90 seconds; the prepolymer coated substrate is soft baked at a temperature of 25° to 60° C. for 15 minutes to 24 hours in a vacuum oven with or without a nitrogen bleed; the soft-baked coating is then imaged with a UV light source (220-320 nm range) for 15 seconds to 30 minutes employing a mask of desired design for vias and the like; the photocured polymer is then developed with an appropriate solvent system (e.g., toluene, toluene/hexane, toluene/ethanol, cyclohexane, etc.) at 25° to 35° C. with or without ultrasonics or via spraying for 15 to 120 seconds; the developed substrate can then be exposed to a stop or rinse bath or solvent spray based upon a solvent system miscible with the developing solvent but a poor solvent for the polymer system (for example hexane, pentane, ethanol, etc.) (optional step); the vias are then cleaned with a plasma or wet etch; and finally the dried substrate is hard baked in vacuum or under an inert atmosphere (nitrogen, argon, etc.) with a preferred cure cycle including a ramp from 25° to 300° C. for 30 minutes to 10 hours, a hold at 300° C. for 5 hours and then a cool down from 300° to 25° C. With a 30 minute to 10 hour ramp.

The process is repeated as required in order to form an electronic interconnect structure of desired electrical and dielectric levels.

EXAMPLE 1

Synthesis of Styrene Terminated Hexafluorobisphenol-A-Formaldehyde (STBPAF6-F (95VBz/5Pr))

Hexafluorobisphenol-A formaldehyde (BPAF6-F) was prepared as follows: 336.24 g (1.00 mole) of hexafluorobisphenol-A, 30.00 g (1.00 mole of formaldehyde functionality) of paraformaldehyde, and 250 mL of ethanol were charged into a 2000 mL 3-neck flask equipped with a mechanical stirrer, thermometer, Therm-O-Watch, condenser, addition funnel and nitrogen purge. The reaction mixture was heated to 60° C., 1.00 mL of concentrated sulfuric acid was added dropwise over a 30 minute interval. The reaction was maintained at 60° C. for 3 days. The solvent was distilled from the reaction mixture and then the resin was dissolved in NMP and coagulated into water, the resin was dried in a vacuum oven at 60° C., yielding 130.0 g of resin, $Mn=280$, $Mw=660$, dispersity of 2.4.

126.60 grams of the above BPAF6-F was dissolved in 250 mL of N-methylpyrrolidinone (NMP) in a 1000 mL 3-neck round bottom flask equipped with mechanical stirrer, addition funnel, condenser, thermometer, nitrogen purge and Therm-O-Watch. To this reaction mixture was added 120.0 g (0.786 moles) of vinylbenzylchloride (60/40 para/meta isomer ratio) and 0.40 g of 2,6-di-tert-butyl-p-cresol (BHT). The reaction mixture was heated to 60° C. and 45.0 g (0.802 moles) of potassium hydroxide in 130 mL of methanol was added dropwise over a 45 minute interval. The reaction was maintained at 60° C. for 19 hrs. with stirring under a nitrogen purge. After cooling to room temperature the reaction mixture was transferred to a separatory funnel, and 2.0 Liters of toluene added and then washed thrice with 4 Liters of water, dried over magnesium sulfate, filtered and concentrated under vacuum. Infrared analysis after workup indicated incomplete capping of the hydroxyl groups; the resin was transferred to 1000 mL 3-neck reaction flask (equipped as above) with 250 mL of NMP. To this reaction mixture was added 57.88 g (0.471 moles) of n-propylbromide was added to the reaction mixture and heated with stirring under purge to 60° C. To this reaction mixture was then added 26.41 g (0.471 moles) of potassium hydroxide in 65 mL of methanol over a 40 minute interval. The reaction was maintained at 60° C. for 24 hours and then allowed to cool to room temperature. The reaction mixture was then transferred to a separatory funnel, and 2.0 Liters of toluene added and then washed thrice with 2 Liters of water and once with saturated sodium chloride solution, dried over magnesium sulfate, filtered and concentrated under vacuum, yielding a red resinous product; $Mn=700$, $Mw=980$, dispersity 1.4.

EXAMPLE 2

Synthesis of Styrene Terminated Hexafluorobisphenol-A-Formaldehyde (STBPAF6-F (70VBz/30Pr))

Hexafluorobisphenol-A formaldehyde (BPAF6-F) was prepared as follows: 336.24 g (1.00 mole) of hexafluorobisphenol-A, 45.00 g (1.50 mole of formaldehyde functionality) of paraformaldehyde, and 250 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 2.00 mL of concentrated sulfuric acid was added dropwise over a 30 minute interval. The reaction was maintained at 60° C. for 1 day. The solvent was distilled from the reaction mixture with the reactor equipped with a Dean-Stark trap and then the resin was dissolved in NMP and coagulated into water, the resin was dried in a vacuum oven at 60° C., yielding 211.0 g of resin; $Mn=570$, $Mw=790$, dispersity of 1.39.

211.00 grams of the above BPAF6-F was dissolved in 350 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 134.0 g (0.878 moles) of vinylbenzylchloride (60/40 para/meta isomer ratio) and 0.10 g of 2,6-di-tert-butyl-p-cresol (BHT). The reaction mixture was heated to 60° C. and 54.2 g (0.966 moles) of potassium hydroxide in 150 mL of methanol was added dropwise over a 1.2 hr interval. The reaction was maintained at 60° C. for 19 hrs. with stirring under a nitrogen purge. 57.5 g (0.467 moles) of n-propylbromide was added to the reaction mixture, to this reaction mixture was then added 26.4 g (0.471 moles) of potassium hydroxide in 80 mL of methanol over a 2 hour interval, the reaction was maintained at 60° C. for 18 hrs. After cooling to room temperature the reaction mixture was transferred to a separatory funnel, 2 Liters of toluene was added and then washed thrice with 2 Liters of water, dried over magnesium sulfate and stripped under vacuum. IR indicates presence of residual hydroxyl moieties; resin transferred to 2000 mL 3-neck round bottom flask (as equipped above) with 350 mL of NMP. 57.5 g (0.467 moles) of n-propylbromide was added to reaction mixture and then heated with stirring under nitrogen purge to 60° C. To this reaction mixture was added 26.4 g (0.471 moles) of potassium hydroxide in 80 mL of methanol over a 2 hour period and the reaction was maintained at 60° C. for 18 hrs. Upon cooling the reaction mixture was transferred to a separatory funnel with 2 Liters of toluene, and then washed twice with 2 Liters of water and once with saturated ammonium chloride solution, dried over sodium sulfate, filtered and then concentrated under vacuum, yielding 236.0 g of resin; $Mn=1600$, $Mw=7200$, dispersity of 4.5.

EXAMPLE 3

Synthesis of Styrene Terminated Hexafluorobisphenol-A-Formaldehyde (STBPAF6-F (70VBz/30Pr))

Hexafluorobisphenol-A formaldehyde (BPAF6-F) was prepared as follows: 336.24 g (1.00 mole) of hexafluorobisphenol-A, 30.00 g (1.00 mole of formaldehyde functionality) of paraformaldehyde, and 125 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 2.00 mL of concentrated sulfuric acid was added dropwise over a 30 minute interval. The reaction was maintained at 80° C. for 1 day. The solvent was distilled from the reaction mixture with the reactor equipped with a Dean-Stark trap and then the resin was dissolved in NMP and coagulated into water. The resin was dried in a vacuum oven at 60° C., yielding 167.2 g of resin; $Mn=620$, $Mw=790$, dispersity of 1.27.

167.2 grams of the above BPAF6-F was dissolved in 550 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 106.28 g (0.696 moles) of vinylbenzylchloride (60/40 para/meta isomer ratio) and 0.20 g of 2,6-di-tert-butyl-p-cresol (BHT). The reaction mixture was heated to 60° C. and 42.98 g (0.760 moles) of potassium hydroxide in 120 mL of methanol was added dropwise over a 1.0 hr interval. The reaction was maintained at 60° C. for 19 hrs. with stirring under a nitrogen purge. 40.05 g (0.326 moles) of n-propylbromide was added to the reaction mixture, to this reaction mixture was then added 18.17 g (0.323 moles) of potassium hydroxide in 80 mL of methanol over a 2 hour interval and the reaction was maintained at 60° C. for 4 hrs. After cooling to room temperature the reaction mixture was transferred to a separatory funnel, 2 Liters of toluene was added and then washed thrice with 2 Liters of water, dried over sodium sulfate and stripped under vacuum. IR indicates presence of residual hydroxyl moieties; the resin was transferred to 2000 mL 3-neck round bottom flask (as equipped above) with 700 mL of NMP. 40.05 g (0.326 moles) of n-propylbromide, and 0.10 g of BHT was added to reaction mixture, and then heated with stirring under nitrogen purge to 60° C. To this reaction mixture is then added 18.17 g (0.323 moles) of potassium hydroxide in 80 mL of methanol over a 2 hour period and the reaction was maintained at 60° C. for 4 hrs. Upon cooling the reaction mixture was transferred to a separatory funnel with 2 Liters of toluene, and then washed twice with 2 Liters of water and once with saturated ammonium chloride solution, dried over sodium sulfate, filtered and then concentrated under vacuum, IR indicates presence of hydroxyl groups; resin transferred to 2000 mL 3-neck round bottom flask (as equipped above) with 700 mL of NMP. 40.05 g (0.326 moles) of n-propylbromide, and 0.10 g of BHT was added to reaction mixture, and then heated with stirring under nitrogen purge to 60° C. To this reaction mixture was added 18.17 g (0.323 moles) of potassium hydroxide in 80 mL of methanol over a 2 hour period and the reaction was maintained at 60° C. for 4 hrs. Upon cooling the reaction mixture was transferred to a separatory funnel with 2 Liters of toluene, then washed twice with 2 Liters of water and once with saturated ammonium chloride solution, dried over sodium sulfate, filtered and then concentrated under vacuum, yielding 96.72 g of resin; $Mn=1300$, $Mw=6900$, dispersity of 5.2.

EXAMPLE 4

Synthesis of Styrene Terminated Hexafluorobisphenol-A-Formaldehyde (STBPAF6-F (70VBz/30Pr))

Hexafluorobisphenol-A formaldehyde (BPAF6-F) was prepared as follows: 336.24 g (1.00 mole) of hexafluorobisphenol-A, 22.50 g (0.750 mole of formaldehyde functionality) of paraformaldehyde, and 125 mL of ethanol were charged into a 2000 mL 3-neck flask equipped with a mechanical stirrer, thermometer, Therm-O-Watch, condenser, addition funnel and nitrogen purge. The reaction mixture was heated to 80° C., 2.00 mL of concentrated sulfuric acid was added dropwise over a 30 minute interval. The reaction was maintained at 80° C. for 1 day. The solvent was distilled from the reaction mixture with the reactor equipped with a Dean-Stark trap and then the resin was dissolved in NMP and coagulated into water, the resin was dried in a vacuum oven at 60° C., yielding 180.78 g of resin.

180.78 grams of the above BPAF6-F was dissolved in 400 mL of N-methylpyrrolidinone (NMP) in a 2000 mL 3-neck round bottom flask equipped with mechanical stirrer, addition funnel, condenser, thermometer, nitrogen purge and Therm-O-Watch. To this reaction mixture was added 114.88 g (0.753 moles) of vinylbenzylchloride (60/40 para/meta isomer ratio) and 0.10 g of 2,6-di-tert-butyl-p-cresol (BHT). The reaction mixture was heated to 60° C. and 52.79 g (0.941 moles) of potassium hydroxide in 150 mL of methanol was added dropwise over a 1.2 hr interval. The reaction was maintained at 60° C. for 19 hrs. with stirring under a nitrogen purge. 43.64 g (0.355 moles) of n-propylbromide was added to the reaction mixture, and then was added 24.88 g (0.443 moles) of potassium hydroxide in 75 mL of methanol over a 2 hour interval and the reaction was maintained at 60° C. for 18 hrs. After cooling to room temperature the reaction mixture was transferred to a separatory funnel, 2 Liters of toluene was added and then washed thrice with 1 Liter of water, dried over magnesium sulfate and stripped under vacuum, yielding a red resinous product; Mn=660, Mw=970, dispersity of 1.5.

EXAMPLE 5

Synthesis of Styrene Terminated Hexafluorobisphenol-A-Formaldehyde (STBPAF6-F (70VBz/30Pr))

Hexafluorobisphenol-A formaldehyde (BPAF6-F) was prepared as follows: 1029.7 g (3.062 mole) of hexafluorobisphenol-A, 68.90 g (2.30 mole of formaldehyde functionality) of paraformaldehyde, and 380 mL of ethanol were charged into a 3000 mL 3-neck flask equipped with a mechanical stirrer, thermometer, Therm-O-Watch, condenser, addition funnel and nitrogen purge. The reaction mixture was heated to 80° C., 6.00 mL of concentrated sulfuric acid was added dropwise over a 30 minute interval. The reaction was maintained at 80° C. for 1 day. The solvent was distilled from the reaction mixture with the reactor equipped with a Dean-Stark trap and then the resin was dissolved in NMP and coagulated into water, the resin was dried in a vacuum oven at 105° C., yielding 908.0 g of resin.

900.0 grams of the above BPAF6-F was dissolved in 2000 mL of N-methylpyrrolidinone (NMP) in a 5000 mL 3-neck round bottom flask equipped with mechanical stirrer, addition funnel, condenser, thermometer, nitrogen purge and Therm-O-Watch. To this reaction mixture was added 572.0 g (3.748 moles) of vinylbenzylchloride (60/40 para/meta isomer ratio) and 0.50 g of 2,6-di-tert-butyl-p-cresol (BHT). The reaction mixture was heated to 60° C. and 263.0 g (4.687 moles) of potassium hydroxide in 500 mL of methanol was added dropwise over a 2.0 hr interval. The reaction was maintained at 60° C. for 19 hrs. with stirring under a nitrogen purge. 299.0 g (2.431 moles) of n-propylbromide was added to the reaction mixture, to this reaction mixture was then added 135.0 g (2.406 moles) of potassium hydroxide in 250 mL of methanol over a 2 hour interval, the reaction was maintained at 60° C. for 4 hrs. After cooling to room temperature the reaction mixture was transferred to a separatory funnel, 4 Liters of toluene was added and then washed thrice with 4 Liters of water, dried over magnesium sulfate and stripped under vacuum, yielding a red resinous product; Mn=490, Mw=1200, dispersity of 2.5.

EXAMPLE 6

Synthesis of Styrene Terminated Hexafluorobisphenol-A-Formaldehyde (STBPAF6-F (70VBz/30Pr))

1138.4 g (3.386 mole) of hexafluorobisphenol-A, 76.18 g (2.539 mole of formaldehyde functionality) of paraformaldehyde, and 430 mL of ethanol were charged into a 5000 mL 3-neck flask equipped with a mechanical stirrer, thermometer, Therm-O-Watch, condenser, addition funnel and nitrogen purge. The reaction mixture was heated to 60° C., 7.00 mL of concentrated sulfuric acid was added dropwise over a 30 minute interval. The reaction was maintained at 60° C. for 1 day. The solvent was distilled from the reaction mixture with the reactor equipped with a Dean-Stark trap. The BPAF6-F Resin was dissolved in 1500 mL of N-methylpyrrolidinone (NMP). To this reaction mixture was added 723.42 g (4.740 moles) of vinylbenzylchloride (60/40 para/meta isomer ratio) and 0.50 g of 2,6-di-tert-butyl-p-cresol (BHT). The reaction mixture was heated to 60° C. and 292.55 g (5.214 moles) of potassium hydroxide in 650 mL of methanol was added dropwise over a 2.5 hr interval. The reaction was maintained at 60° C. for 19 hrs. with stirring under a nitrogen purge. 333.12 g (2.708 moles) of n-propylbromide was added to the reaction mixture, to this reaction mixture was then added 151.97 g (2.708 moles) of potassium hydroxide in 350 mL of methanol over a 2 hour interval, the reaction was maintained at 60° C. for 4 hrs. After 4 hrs. a small (50 mL) sample of the reaction mixture was worked up and analyzed, the sample showed residual hydroxyl groups. 150.0 g (1.220 moles) of n-propylbromide was added to the reaction mixture at 60° C., and then 75.0 g (1.337 moles) of potassium hydroxide in 180 mL of methanol was added over a 1 hr interval and then heated at 60° C. for 18 hrs. A small sample (50 mL) of the reaction mixture was worked up and analyzed, once again residual hydroxyl groups were found. 75.0 g (0.610 moles) of n-propylbromide was added to the reaction mixture and then heated to 60° C. with stirring under a nitrogen purge, 75.0 g (1.337 moles) of potassium hydroxide in 180 of methanol was added to the reaction mixture over a 1 hour interval, the reaction was maintained at 60° C. for 4 hour. Upon cooling to room temperature the reaction mixture was transferred to a separatory funnel, 4.5 Liters of toluene was added and then washed twice with 2 Liters of water, and once with saturated ammonium chloride solution, dried over sodium sulfate and stripped under vacuum, yielding a red resinous product; Mn=3300, Mw=5000, dispersity of 1.5.

EXAMPLE 7

Synthesis of Styrene Terminated Hexafluorobisphenol-A-Formaldehyde (STBPAF6-F (70VBz/30Pr))

795.6 g (2.366 mole) of hexafluorobisphenol-A, 35.4 g (1.180 mole of formaldehyde functionality) of paraformaldehyde, and 300 mL of ethanol were charged into a 5000 mL 3-neck flask equipped with a mechanical stirrer, thermometer, Therm-O-Watch, condenser, addition funnel and nitrogen purge. The reaction mixture was heated to 80° C., 5.00 mL of concentrated sulfuric acid was added dropwise over a 30 minute interval. The reaction was maintained at 80° C. for 1 day. The solvent was distilled from the reaction mixture with the reactor equipped with a Dean-Stark trap. The BPAF6-F Resin was dissolved in 1600 mL of N-methylpyrrolidinone (NMP). To this reaction mixture was added 505.6 g (3.313 moles) of vinylbenzylchloride (60/40 para/meta isomer ratio) and 0.25 g of 2,6-di-tert-butyl-p-cresol (BHT). The reaction mixture was heated to 60° C. and 185.89 g (3.313 moles) of potassium hydroxide in 400 mL of methanol was added dropwise over a 2.0 hr interval. The reaction was maintained at 60° C. for 18 hrs. with stirring under a nitrogen purge. 290.99 g (2.365 moles) of n-propylbromide was added to the reaction mixture, to this reaction mixture was then added 132.75 g (2.366 moles) of potassium hydroxide in 280 mL of methanol over a 1 hour interval, the reaction was maintained at 60° C. for 24 hrs. Upon cooling to room temperature the reaction mixture was transferred to a separatory funnel, 4.0 Liters of toluene was added and then washed twice with 2 Liters of water, and once with saturated ammonium chloride solution, dried over sodium sulfate and stripped under vacuum, yielding 864.7 g of resin; Mn=480, Mw=700, dispersity of 1.5.

EXAMPLE 8

Synthesis of Styrene Terminated Hexafluorobisphenol-A-Formaldehyde (STBPAF6-F (70VBz/30Pr))

2131.9 g (6.340 mole) of hexafluorobisphenol-A, 142.80 g (4.760 mole of formaldehyde functionality) of paraformaldehyde, and 1200 mL of ethanol were charged into a 12000 mL 3-neck flask equipped with a mechanical stirrer, thermometer, Therm-O-Watch, condenser, addition funnel and nitrogen purge. The reaction mixture was heated to 60° C., 15.00 mL of concentrated sulfuric acid was added dropwise over a 44 minute interval. The reaction was maintained at 60° C. for 1 day. The solvent was distilled from the reaction mixture with the reactor equipped with a Dean-Stark trap. The BPAF6-F Resin was dissolved in 3700 mL of N-methylpyrrolidinone (NMP). To this reaction mixture was added 1390.3 g (9.110 moles) of vinylbenzylchloride (60/40 para/meta isomer ratio) and 1.30 g of 2,6-di-tert-butyl-p-cresol (BHT). The reaction mixture was heated to 60° C. and 622.5 g (11.094 moles) of potassium hydroxide in 1200 mL of methanol was added dropwise over a 2.0 hr interval. The reaction was maintained at 60° C. for 46 hrs. with stirring under a nitrogen purge. 833.0 g (6.772 moles) of n-propylbromide was added to the reaction mixture, and then was added 355.8 g (6.341 moles) of potassium hydroxide in 900 mL of methanol over a 45 minute interval, the reaction was maintained at 60° C. for 20 hrs. Upon cooling, a small (50 mL) sample of the reaction mixture was worked up and analyzed, the sample showed residual hydroxyl groups. 320.0 g (2.602 moles) of n-propylbromide was added to the reaction mixture and then heated with stirring under a nitrogen purge to 60° C., and then 146.0 g (2.602 moles) of potassium hydroxide in 300 mL of methanol was added over a 30 minute interval and maintained at 60° C. for 18 hrs. Upon cooling to room temperature the reaction mixture was transferred to a separatory funnel, 6.0 Liters of toluene was added and then washed twice with 4 Liters of water, and once with saturated ammonium chloride solution, dried over magnesium sulfate and stripped under vacuum, IR indicates small residual hydroxyl group. Resin taken up in 3000 mL of NMP and recharged into 12000 mL reactor as equipped above. 1.2 g of BHT, and 300.0 g (2.439 moles) of n-propylbromide was added to the reaction mixture and then heated with stirring under a nitrogen purge to 60° C. Then 136.0 g (2.424 moles) of potassium hydroxide in 300 mL of methanol was added over a 2 hour interval and maintained at 60° C. for 18 hrs. Upon cooling to room temperature the reaction mixture was transferred to a separatory funnel, 6.0 Liters of toluene was added and then washed twice with 4 Liters of water, and once with saturated ammonium chloride solution, dried over magnesium sulfate, filtered, and concentrated under vacuum, yielding a red resinous product; Mn=810, Mw=12500, dispersity of 15.0.

EXAMPLE 9

Synthesis of Styrene Terminated Hexafluorobisphenol-A-Formaldehyde (STBPAF6-F (60VBz/40Pr))

2164.0 g (6.436 mole) of hexafluorobisphenol-A, 144.95 g (4.832 mole of formaldehyde functionality) of paraformaldehyde, and 1200 mL of ethanol were charged into a 12000 mL 3-neck flask equipped with a mechanical stirrer, thermometer, Therm-O-Watch, condenser, addition funnel and nitrogen purge. The reaction mixture was heated to 80° C., 15.00 mL of concentrated sulfuric acid was added dropwise over a 40 minute interval. The reaction was maintained at 80° C. for 1 day. The solvent was distilled from the reaction mixture with the reactor equipped with a Dean-Stark trap. The BPAF6-F Resin was dissolved in 4600 mL of N-methylpyrrolidinone (NMP). To this reaction mixture was added 1178.7 g (7.723 moles) of vinylbenzylchloride (60/40 para/meta isomer ratio) and 1.13 g of 2,6-di-tert-butyl-p-cresol (BHT). The reaction mixture was heated to 60° C. and 541.7 g (9.654 moles) of potassium hydroxide in 1000 mL of methanol was added dropwise over a 4.25 hr interval. The reaction was maintained at 60° C. for 18 hrs. with stirring under a nitrogen purge. 791.6 g (6.436 moles) of n-propylbromide was added to the reaction mixture, to this reaction mixture was then added 361.12 g (6.436 moles) of potassium hydroxide in 800 mL of methanol over a 2.5 hour interval, the reaction was maintained at 60° C. for 44 hrs. Upon cooling, a small (50 mL) sample of the reaction mixture was worked up and analyzed, the sample showed residual hydroxyl groups. 316.65 g (2.574 moles) of n-propylbromide was added to the reaction mixture and then heated with stirring under a nitrogen purge to 60° C. Then, 144.45 g (2.574 moles) of potassium hydroxide in 300 mL of methanol was added over a 2 hour interval and maintained at 60° C. for 18 hrs. Upon cooling to room temperature the reaction mixture was transferred to a separatory funnel, 8.0 Liters of toluene was added and then washed twice with 4 Liters of water, twice with 7 Liters of water, and twice with saturated ammonium chloride solution, dried over magnesium sulfate, filtered, and then concentrated under vacuum, yielding 2724.1 g of resin; Mn=750, Mw=1300, dispersity of 1.7.

EXAMPLE 10

Synthesis of Styrene-Terminated Tetraphenol Ethane (70% Vinylbenzyl/30% Propyl)(STTPE(70 VBz/30 Pr))

To a 250 mL round bottom, 3-neck flask equipped with a stirring shaft, an addition funnel and a condenser was added 25.0 g tetraphenol ethane (TPE) (Mn=274, Mw=711) (0.0354 mol), 0.23 g BHT (0.00106 mol) and 120 mL N-methyl pyrollidinone (NMP). Upon dissolution of the TPE, 26.48 g vinylbenzyl chloride (VBC)(0.174 mol) were added and the vessel flushed and placed under positive nitrogen pressure by means of a mineral oil bubbler. The solution was heated to 60° C. by means of a water bath and 11.34 g KOH (0.177 mol) dissolved in 25 mL of methanol were added dropwise over 30 minutes. The mixture was kept at 60° C. for an additional 3.5 hours, 9.0 mL 1-bromopropane (0.099 mol) was added. 4.86 g KOH (0.0758 mol) dissolved in 11 mL methanol was then added dropwise over 30 minutes and the temperature maintained at 50° C. an additional 1.5 hours.

The mixture was cooled and slowly added to 600 mL of methanol leaving a solid yellow mass. The methanol was decanted and the solids along with fresh methanol were placed in a blender to produce an oily solid which was collected on a Buchner funnel. This material was dissolved in dichloromethane and washed with 4×500 mL water. The organic phase was dried over sodium sulfate and filtered through Celite. Solvent was removed by rotary evaporation leaving an orange semi-solid, 49% yield. GPC examination of resin indicates Mn=1040, Mw=1290, dispersity 1.24. Infrared examination of resin indicates some residual OH (<5%), ion chromatography indicates: 17 ppm Cl—, <1 ppm Br—, 1 ppm $SO_4^{-2}$.

EXAMPLE 11

Synthesis of Styrene Terminated Tetraphenol Ethane (100% Vinylbenzyl)(STTPE (100 VBz))

To a 2-L, 3-neck round bottom flask equipped with a stirring shaft, an additional funnel and a condenser was added 200.0 g tetraphenol ethane (TPE) (Mn=274, Mw=711)(0.284 mol), 1.88 g BHT (0.00852 mol) and 950 mL N-methyl pyrollidinone (NMP). Upon dissolution of the TPE 242.65 g vinylbenzyl chloride (VBC) (1.59 mol) was added and the vessel flushed and placed under positive nitrogen pressure by means of a mineral oil bubbler. The solution was heated to 60° C. by a water bath and 101.95 g KOH (1.59 mol) dissolved in 230 mL of methanol were added dropwise over 30 minutes. The mixture was kept at 60° C., for an additional 4.7 hours and 15.17 g VBC (0.0994 mol) was then added. 6.37 g KOH (0.0994 mol) dissolved in 15 mL methanol was then added dropwise. A final identical addition of VBC and KOH/methanol was made 1.7 hours later and the reaction maintained at 60° C. for 1 hour longer.

The mixture was cooled and 1.2 L toluene were added. The mixture was washed with 1×3 L water and 2×3 L 1M NaCl (aq). The organic phase was dried over sodium sulfate, slurried with Celite and filtered. Solvent was removed by rotary evaporation up to 40° C. at 3 torr leaving a viscous brown resin, 95% yield. GPC analysis found Mn=778, Mw=1079, dispersity 1.39; Infrared analysis indicates no residual hydroxyl (<0.5%); Ion Chromatography found: 45 ppm C—.

EXAMPLE 12

A series (Samples 1, 3, and 5 below) of mixtures of styrene-terminated hexafluorobisphenol-A formaldehyde (STBPAF6-F) of Example 5 and styrene-terminated tetraphenol ethane (STTPE) of Example 10 were prepared and cured via the following cure cycle: 2 hrs. at 80° C., 16 hrs. at 100° C., 4 hrs. at 120° C., 16 hrs. at 160° C., 2 hrs. at 200° C. and 1 hour at 225° C. and their properties were measured.

Another series of mixtures were prepared from STBPAF6-F of Example 2 and STTPE of Example 10 are prepared and cured by the same curing cycle. These are samples 2 and 4 in the table below.

TABLE A

| Sample No. | 1 | 2 | 3 | 4 | 5 |
|---|---|---|---|---|---|
| STBPAF6-F STTPE | (90/10) | (90/10) | (75/25) | (75/25) | (50/50) |
| Tg (°C.)[a] | >300 | >300 | >300 | >300 | >300 |
| Tsp (°C.)[b] | 151 ± 2 | 152 ± 7 | 165 ± 3 | 162 ± 6 | 168 ± 5 |
| $a_{sp}$ (ppm/°C.)[c] | 69 ± 5 | 59 ± 5 | 61 ± 1 | 65 ± 4 | 69 ± 9 |
| $a_{260}$ (ppm/°C.)[d] | 95 ± 1 | 77 ± 4 | 77 ± 4 | 83 ± 4 | 93 ± 7 |
| $\epsilon'$[e] | 2.72 | 3.01 | 2.82 | 2.99 | 2.85 |
| tan δ[f] | 0.001 | 0.002 | 0.002 | 0.002 | 0.002 |
| $\epsilon'$[g] | 2.81 | 3.09 | 2.86 | 3.05 | 2.94 |
| tan δ[h] | 0.001 | 0.004 | 0.002 | 0.001 | 0.003 |
| % Water Absorption[i] | 0.126 | 0.296 | 0.135 | 0.294 | 0.150 |
| Modulus (GPA)[j] | 9.1 | — | 9.0 | — | 9.0 |

TABLE A-continued

| Sample No. | 1 | 2 | 3 | 4 | 5 |
|---|---|---|---|---|---|
| Tg (°C.)[k] | >200 | — | >200 | | >200 |

[a] glass transition temperature by differential scanning calorimeter
[b] softening point by Thermo Mechanical Analysis - minor thermal transition
[c] coefficient of thermal expansion between 25° C. and softening point
[d] coefficient of thermal expansion between 25° and 260° C.
[e] dielectric constant at 1 MHz and 0% Relative Humidity at 25° C.
[f] loss tangent at 1 MHz and 0% Relative Humidity at 25° C.
[g] dielectric constant at 1 MHz and 50% Relative Humidity at 25° C.
[h] loss tangent at 1 MHz and 50% Relative Humidity at 25° C.
[i] at 50% Relative Humidity, 25° C. for 168 hours
[j] modulus measured from −125° C. to 200° C. at 4 Hz
[k] glass transition temperature by DMA at 4 Hz, scanned from −125° C. to 200° C.

EXAMPLE 13

A series of coating solutions were prepared and used to coat silicon surfaces. The solution concentrations were between 57.4 and 70 wt. % of STBPAF6-F from Example 5 and STTPE from Example 10 in toluene. The solutions were applied by spin coating at 800–1000 rpm for 60 seconds. The coated discs were soft baked at 25° C. for 18 hours under vacuum. Then, they were exposed for 3 minutes to UV irradiation with a 300 watt mercury vapor lamp with a quartz/water filter. The irradiated coatings were then exposed to various solvents and the amount of cured resin dissolved was measured. The results are shown in the following tables.

TABLE B

| Time (sec) | % STBPAF6-F/STTPE (90:10) Removed[a] Solvent (Toluene:Ethanol)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 15.32 | 27.94 | 4.04 | 6.75 | 0.22 | −0.22 |
| 60 | 19.91 | 31.64 | 4.93 | 6.97 | 1.32 | −1.33 |
| 90 | 19.91 | 32.79 | 5.38 | 6.97 | 1.10 | −2.00 |
| 120 | 21.23 | 33.03 | 7.40 | 3.92 | 3.30 | −1.11 |
| 180 | 22.10 | 35.10 | 7.40 | 8.71 | 2.42 | −0.67 |
| 300 | 21.44 | 34.18 | 6.95 | 10.02 | 2.20 | −0.22 |

[a] STBPAF6-F/STTPE coated on silicon wafer and soft baked at 25° C. for 18 Hrs., 3 minute cure 300 Watt Mercury Vapor Lamp with quartz/water filter.
[b] Weight % solutions.

Table B may be compared with the results of Table C below in which only the soft bake was carried out and no curing by UV radiation was done.

TABLE C

| Time (sec) | % STBPAF6-F/STTPE (90:10) Removed[a] Solvent (Toluene:Ethanol)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 99.59 | 98.53 | 95.77 | 95.79 | 23.98 | −1.29 |
| 60 | 98.78 | 98.74 | 98.31 | 98.20 | 32.33 | 1.72 |
| 90 | 99.39 | 98.95 | 97.25 | 98.80 | 35.55 | 0.86 |
| 120 | 99.39 | 99.16 | 98.52 | 99.40 | 40.26 | 1.72 |
| 180 | 99.39 | 100.00 | 99.37 | 99.80 | 44.54 | 2.15 |
| 300 | 100.00 | 98.95 | 97.89 | 98.00 | 46.68 | 1.93 |

[a] STBPAF6-F/STTPE coated on silicon wafer and soft baked at 25° C. for 18 Hrs.
[b] Weight % solutions.

Table D and E are comparisons of the effect of UV radiation is demonstrated utilizing solvent systems based on toluene:ethanol.

TABLE D

| Time (sec) | % STBPAF6-F/STTPE (90:10) Removed[a] Solvent (Toluene:n-Hexane)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 15.32 | 99.77 | 32.34 | 35.52 | 0.45 | −0.46 |
| 60 | 19.91 | 100.45 | 40.37 | 43.67 | 1.81 | 0.23 |
| 90 | 19.91 | 100.68 | 41.51 | 46.38 | 0.00 | −1.85 |
| 120 | 21.23 | 101.36 | 43.12 | 49.77 | 1.35 | 0.69 |
| 180 | 22.10 | 100.23 | 43.12 | 50.00 | 0.90 | −0.23 |
| 300 | 21.44 | 100.23 | 44.04 | 52.04 | 1.81 | 0.69 |

[a] STBPAF6-F/STTPE coated on silicon wafer and soft baked at 25° C. for 18 Hrs., 3 minute cure 300 Watt Mercury Vapor Lamp with quartz/water filter.
[b] Weight % solutions.

TABLE E

| Time (sec) | % STBPAF6-F/STTPE (90:10) Removed[a] Solvent (Toluene:n-Hexane)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 99.59 | 99.11 | 98.05 | 98.53 | 34.92 | 0.90 |
| 60 | 98.78 | 99.33 | 99.35 | 99.37 | 50.76 | 2.03 |
| 90 | 99.39 | 99.11 | 99.35 | 98.11 | 57.92 | 0.90 |
| 120 | 99.39 | 99.33 | 99.57 | 99.37 | 63.12 | 2.93 |
| 180 | 99.39 | 99.33 | 99.57 | 98.74 | 67.03 | 1.80 |
| 300 | 100.00 | 99.78 | 98.92 | 100.42 | 72.89 | 1.80 |

[a] STBPAF6-F/STTPE coated on silicon wafer and soft baked at 25° C. for 18 Hrs.
[b] Weight % solutions.

The following tables, F and G, may be compared with Tables H and I and the effect of UV radiation on the resin is demonstrated.

TABLE F

| Time (sec) | % STBPAF6-F/STTPE (75:25) Removed[a] Solvent (Toluene:Ethanol)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 97.31 | 97.56 | 96.78 | 96.85 | 28.21 | 3.33 |
| 60 | 99.27 | 98.78 | 99.50 | 98.06 | 40.00 | 2.31 |
| 90 | 97.56 | 97.07 | 98.51 | 96.85 | 46.41 | 3.08 |
| 120 | 99.27 | 96.82 | 98.76 | 98.06 | 52.56 | 4.10 |
| 180 | 98.29 | 97.07 | 98.51 | 98.06 | 56.41 | 3.59 |
| 300 | 98.04 | 98.53 | 97.52 | 97.82 | 63.08 | 3.85 |

[a] STBPAF6-F/STTPE coated on silicon wafer and soft baked at 25° C. for 18 Hrs.
[b] Weight % solutions.

TABLE G

| Time (sec) | % STBPAF6-F/STTPE (75:25) Removed[a] Solvent (Toluene:n-Hexane)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 97.31 | 97.22 | 100.00 | 99.75 | 35.48 | 2.05 |
| 60 | 99.27 | 96.46 | 99.49 | 100.00 | 56.30 | 3.08 |
| 90 | 97.56 | 98.23 | 100.51 | 100.75 | 62.47 | 3.85 |
| 120 | 99.27 | 97.98 | 100.26 | 98.51 | 65.04 | 3.33 |
| 180 | 98.29 | 98.74 | 100.77 | 100.50 | 72.24 | 9.49 |
| 300 | 98.04 | 98.74 | 101.02 | 101.24 | 71.47 | 9.49 |

[a] STBPAF6-F/STTPE coated on silicon wafer and soft baked at 25° C. for 18 Hrs.
[b] Weight % solutions.

TABLE H

% STBPAF6-F/STTPE (75:25) Removed[a]

| Time (sec) | Solvent (Toluene:Ethanol)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 0.46 | 1.41 | 1.96 | 6.81 | 0.00 | −1.70 |
| 60 | 0.46 | 2.58 | 4.65 | 12.17 | 0.51 | 0.24 |
| 90 | 0.00 | 1.87 | 4.89 | 11.92 | 0.51 | −1.94 |
| 120 | 1.84 | 2.81 | 6.11 | 14.36 | 1.52 | 0.24 |
| 180 | 0.69 | 2.34 | 4.65 | 12.90 | 1.52 | −0.73 |
| 300 | 1.61 | 3.75 | 7.09 | 13.63 | 2.78 | 0.00 |

[a]STBPAF6-F/STTPE coated on silicon wafer and soft baked at 25° C. for 18 Hrs., 3 minute cure 300 Watt Mercury Vapor Lamp with quartz/water filter.
[b]Weight % solutions.

TABLE I

% STBPAF6-F/STTPE (75:25) Removed[a]

| Time (sec) | Solvent (Toluene:n-Hexane)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 0.46 | 50.25 | −0.25 | 11.91 | −0.75 | −1.20 |
| 60 | 0.46 | 55.94 | 0.25 | 15.88 | 0.25 | −1.45 |
| 90 | 0.00 | 56.44 | 1.01 | 16.63 | −0.50 | −1.69 |
| 120 | 1.84 | 55.94 | −0.25 | 18.36 | −0.50 | −1.93 |
| 180 | 0.69 | 58.42 | 0.50 | 21.34 | 1.00 | −0.72 |
| 300 | 1.61 | 58.42 | 1.51 | 21.09 | 0.75 | −0.48 |

[a]STBPAF6-F/STTPE coated on silicon wafer and soft baked at 25° C. for 18 Hrs., 3 minute cure 300 Watt Mercury Vapor Lamp with quartz/water filter.
[b]Weight % solutions.

The following tables, J and K, may be compared with Tables L and M and the effect of UV radiation on the resin is demonstrated.

TABLE J

% STBPAF6-F/STTPE (50:50) Removed[a]

| Time (sec) | Solvent (Toluene:Ethanol)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 99.15 | 99.71 | 92.59 | 98.27 | 19.50 | −2.65 |
| 60 | 98.31 | 99.14 | 99.43 | 98.27 | 28.97 | −1.47 |
| 90 | 100.28 | 100.57 | 97.44 | 100.00 | 35.65 | −0.29 |
| 120 | 99.15 | 99.14 | 99.15 | 99.13 | 38.44 | −0.59 |
| 180 | 99.44 | 100.29 | 100.28 | 100.29 | 45.96 | 0.59 |
| 300 | 100.28 | 100.00 | 100.57 | 100.29 | 101.11 | 1.77 |

[a]STBPAF6-F/STTPE coated on silicon wafer and soft baked at 25° C. for 18 Hrs.
[b]Weight % solutions.

TABLE K

% STBPAF6-F/STTPE (50:50) Removed[a]

| Time (sec) | Solvent (Toluene:n-Hexane)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 99.15 | 98.85 | 91.76 | 50.15 | −4.20 | −2.05 |
| 60 | 98.31 | 97.71 | 98.24 | 79.53 | −1.20 | −2.05 |
| 90 | 100.28 | 100.29 | 100.88 | 91.39 | 2.70 | −2.35 |
| 120 | 99.15 | 97.99 | 97.94 | 93.47 | 8.41 | −1.17 |
| 180 | 99.44 | 100.57 | 100.88 | 97.92 | 15.62 | −0.88 |
| 300 | 100.28 | 100.00 | 100.00 | 97.63 | 16.52 | −2.93 |

[a]STBPAF6-F/STTPE coated on silicon wafer and soft baked at 25° C. for 18 Hrs.
[b]Weight % solutions.

TABLE L

% STBPAF6-F/STTPE (50:50) Removed[a]

| Time (sec) | Solvent (Toluene:Ethanol)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 3.08 | 4.39 | 5.90 | 4.29 | 0.88 | 1.18 |
| 60 | 1.68 | 7.31 | 8.26 | 3.71 | 0.59 | 0.29 |
| 90 | 2.80 | 10.23 | 10.62 | 6.29 | 0.88 | 1.18 |
| 120 | 1.68 | 10.53 | 10.32 | 5.71 | 1.47 | −0.29 |
| 180 | 4.20 | 14.33 | 12.68 | 8.57 | 3.83 | 1.18 |

TABLE L-continued

% STBPAF6-F/STTPE (50:50) Removed[a]

| Time (sec) | Solvent (Toluene:Ethanol)[b] | | | | | |
|---|---|---|---|---|---|---|
| | 100:0 | 80:20 | 60:40 | 40:60 | 20:80 | 0:100 |
| 300 | 5.60 | 15.79 | 13.57 | 8.29 | 17.40 | 0.88 |

[a]STBPAF6-F/STTPE coated on silicon wafer and soft baked at 25° C. for 18 Hrs., 3 minute cure 300 Watt Mercury Vapor Lamp with quartz/water filter.
[b]Weight % solutions.

TABLE M

% STBPAF6-F/STTPE (50:50) Removed[a]

| Time (sec) | Solvent (Toluene:n-Hexane)[b] | | | | | |
|---|---|---|---|---|---|---|
| | 100:0 | 80:20 | 60:40 | 40:60 | 20:80 | 0:100 |
| 0 | 0 | 0 | 0 | 0 | 0 | 0 |
| 30 | 3.08 | 7.78 | 13.89 | 11.02 | −1.48 | −0.91 |
| 60 | 1.68 | 13.47 | 24.07 | 17.85 | −2.66 | −2.73 |
| 90 | 2.80 | 15.27 | 32.10 | 25.20 | −0.89 | −1.82 |
| 120 | 1.68 | 15.27 | 37.04 | 31.50 | 0.30 | −.091 |
| 180 | 4.20 | 15.27 | 41.98 | 37.01 | 2.07 | 0.00 |
| 300 | 5.60 | 15.87 | 42.90 | 40.16 | 1.78. | 2.12 |

[a]STBPAF6-F/STTPE coated on silicon wafer and soft baked at 25° C. for 18 Hrs., 3 minute cure 300 Watt Mercury Vapor Lamp with quartz/water filter.
[b]Weight % solutions.

EXAMPLE 14

STBPAF6-F resin of Example 7 and STTPE resin of Example 10 were dissolved in toluene to yield a solution of composition 42.0% STBPAF6-F, 14.0% STTPE and 44.0% toluene (ratio of 75:25 STBPAF6-F:STTPE). This solution was spin coated onto a silicon surface utilizing spin coating rates from 600 rpm to 2000 rpm for 60 seconds; and soft baked for 24 hours at 25° C. under vacuum. The samples were then exposed for 3 minutes to UV irradiation with a 300 watt mercury lamp employing an USAF Test Pattern and a quartz-/water filter. The photocured polymer was then developed with toluene for 1 minute at 25° C. The air dried substrate was hard baked employing a cure cycle under vacuum of 25° C. to 219° C. ramp in 1 hour, held at 219° C. for 2.5 hours and then cooled to room temperature.

The film thickness and sidewall angle of the photocured polymer were analyzed utilizing a Sloan Technology Corporation Dektak 3030 profilometer with the following results:

TABLE N

| Spin Speed rpm) | Film thickness (μm) | Sidewall Angle |
|---|---|---|
| 600 | 14.0 | 37 |
| 600 | 15.5 | 30 |
| 600 | 15.0 | 40 |
| 600 | 15.8 | 22 |
| 700 | 16.0 | 25 |
| 700 | 15.3 | 35 |
| 700 | 15.3 | 9 |
| 700 | 18.3 | 45 |
| 800 | 14.8 | 35 |
| 800 | 15.0 | 40 |
| 800 | 14.3 | 42 |
| 800 | 12.8 | 42 |
| 1000 | 12.8 | 29 |
| 1000 | 13.7 | 30 |
| 1000 | 13.0 | 29 |
| 1500 | 10.5 | 25 |
| 1500 | 10.8 | 28 |
| 2000 | 9.0 | 28 |
| 2000 | 9.2 | 26 |
| 2000 | 8.8 | 28 |
| 2000 | 9.0 | 22 |

EXAMPLE 15

STBPAF6-F resin of Example 7 and STTPE resin of Example 10 were dissolved in toluene to yield a solution of composition ratio of 75:25 STBPAF-6-F:STTPE, with ranges of solids contents from 57.4% to 70.4% resins and 29.6% to 42.6% toluene. These solutions were spin coated onto a silicon surface utilizing spin coating rates from 700 rpm to 1500 rpm for 60 seconds; and soft baked for 24 hours at 25° C. under vacuum. The samples were then exposed for 3 minutes to UV irradiation with a 300 watt mercury lamp employing an USAF Test Pattern and a quartz/water filter. The photocured polymer was then developed with toluene for 1 minute at 25° C. The air dried substrate was hard baked employing a cure cycle under vacuum of 25° C. to 220° C. ramp in 1 hour, held at 220° C. for 2.5 hours and then cooled to room temperature.

The film thickness of the photocured polymer was analyzed employing a Taylor-Hobson Talysurf 10 profilometer with the following results:

TABLE O

| ST-Resin (Wt. %) | Viscosity (mPa s) | Spin Speed (rpm) | Film thickness (μm) |
|---|---|---|---|
| 57.4 | 11 | 700 | 7.8 |
| 57.4 | 11 | 1000 | 6.1 |
| 57.4 | 11 | 1500 | 5.1 |
| 61.2 | 16 | 700 | 9.7 |
| 61.2 | 16 | 1500 | 6.6 |
| 70.4 | 216 | 700 | 19.0 |
| 70.4 | 216 | 1000 | 14.0 |
| 70.4 | 216 | 1500 | 12.4 |

EXAMPLE 16

STBPAF6-F resin of Example 7 and STTPE resin of Example 10 were dissolved in toluene to yield a solution of composition ratio of 75:25 STBPAF6-F:STTPE, with ranges of solids contents from 57.4% to 70.4% resins and 29.6% to 42.6% toluene. These solutions were spin coated onto a silicon surface utilizing spin coating rates from 700 rpm to 1500 rpm for 60 seconds; and soft baked for 24 hours at 25° C. under vacuum. The samples were then exposed for 3 minutes to UV irradiation with a 300 watt mercury lamp employing an USAF Test Pattern and a quartz/water filter. The photocured polymer was then developed with toluene for 1 minute at 25° C. The air dried substrate was hard baked employing a cure cycle under vacuum of 25° C. to 220° C. ramp in 1 hour, held at 220° C. for 2.5 hours and then cooled to room temperature. The samples were then metallized via ion-beam sputtering to yield a metal film of thickness 5000 to 10000 Å.

The adhesion was evaluated via a calibrated "Scotch-Tape" adhesion test before and after thermal shock cycling. A thermal shock cycle encompasses the following thermal cycling of the sample: hold at −55° C. for 10 minutes, −55° C. to 125° C. over a rapid ramp, hold at 125° C. for 10 minutes. In the following tables the ratio given means that for 25 squares of the metal, some to all of them were not removed by the tape. That is, 25/25 means that all the squares remained adhered to the dielectric polymer while 5/25 means that 20 squares of metal were removed.

TABLE P

| | Adheon Measurements Results | | | | | |
|---|---|---|---|---|---|---|
| | Before Thermal Shock Cycling | | After 92 Cycles | | After 184 Cycles | |
| Metal Layer | 2.5 lb.(b) | 10.0 lb. | 2.5 lb. | 10.0 lb. | 2.5 lb. | 10.0 lb. |
| Chromium | 25/25 Passed | 25/25 Passed | 25/25 Passed | 25/25 Passed | 25/25 Passed | 25/25 Passed |
| Chromium | 0/25 Passed | — | — | — | — | — |
| Copper | 19/25 Passed | 19/19 Passed | 0/19 Passed | — | — | — |
| Copper | 1/25 Passed | 0/1 Passed | — | — | — | — |
| Aluminum | 25/25 Passed | 25/25 Passed | 24/25 Passed | 25/25 Passed | a | a |
| Aluminum | 25/25 Passed | 25/25 Passed | a | a | a | a |
| Gold | 0/25 Passed | — | — | — | — | — |
| Gold | 0/25 Passed | — | — | — | — | — |
| Nickel | 1/25 Passed | 0/1 Passed | — | — | — | — |
| Nickel | 0/25 Passed | — | — | — | — | — | a Sample not evaluated.
b Tape rating in lb. for ½ inch wide tape.

EXAMPLE 17

STBPAF6-F resin of Example 5 and STTPE resin of Example 10 were dissolved in toluene to yield a solution of composition ratio 75:25 STBPAF6-F:STTPE, with solids contents of 42.0% STBPAF6-F, 14.0% STTPE and 44.0% toluene. This solution was spin coated onto an alumina or silicon substrate (surface) utilizing spin coating rate of 1000 rpm for 60 seconds; soft baked for 1 hour at 60° C. under nitrogen. The polymer was hard baked employing a cure cycle under nitrogen of 25° C. to 220° C. ramp in 3 hour, held at 220° C. for 2.0 hours and then ramped from 220° C. to 25° C. in 4 hours.

The adhesion was evaluated via a calibrated "Scotch-Tape" adhesion test before and after thermal shock cycling. A thermal shock cycle encompasses the following thermal cycling of the sample: hold at −55° C. for 10 minutes, −55° C. to 125° C. over a rapid ramp, hold at 125° C. for 10 minutes.

TABLE Q

| | Adhesion Measurements Results | | | |
|---|---|---|---|---|
| | Before Thermal Shock Cycling | | After 92 Cycles | |
| Substrate | 2.5 lb. | 10.0 lb. | 2.5 lb. | 10.0 lb. |
| Alumina | 0/25 Passed | — | — | — |
| Silicon | 0/25 Passed | — | — | — |

EXAMPLE 18

STBPAF6-F resin of Example 5 and STTPE resin of Example 10 were dissolved in toluene to yield a solution of composition ratio 75:25 STBPAF6-F:STTPE, with solids contents of 42.0% STBPAF6-F, 14.0% STTPE and 44.0% toluene. This solution was spin coated onto an alumina substrate (surface) onto which had been ion-sputtered with a metal film of thickness 5000Å, utilizing spin coating rate of 1000 rpm for 60 seconds; soft baked for 1 hour at 60° C. under nitrogen. The polymer was hard baked employing a cure cycle under nitrogen of 25° C. to 220° C. ramp in 3 hours, held at 220° C. for 2.0 hours and then ramped from 220° C. to 25° C. in 4 hours.

The adhesion was evaluated via a calibrated "Scotch-Tape" adhesion test before and after thermal shock cycling. A thermal shock cycle encompasses the following thermal cycling of the sample: hold at −55° C. for 10 minutes, −55° C. to 125° C. over a rapid ramp, hold at 125° C. for 10 minutes.

TABLE R

| Metal Layer | Adhesion Measurements Results | | | |
|---|---|---|---|---|
| | Before Thermal Shock Cycling | | After 92 Cycles | |
| | 2.5 lb. | 10.0 lb. | 2.5 lb. | 10.0 lb. |
| Chromium | 25/25 Passed | 25/25 Passed | a | a |
| Nickel | 0/25 Passed(b) | — | — | — |
| Copper | 0/25 Passed(b) | — | — | — |
| Aluminum | 3/25 Passed | 0/3 Passed | — | — |
| Gold | 0/25 Passed(b) | — | — | — | a Sample not evaluated.
b Failed at polymer to metal interface.

As can be seen with the above Examples 16–18 chromium adhered particularly well to the dielectric polymers and thus can serve as a suitable base for copper layers which provide conductive patterns in the multilevel structures.

We claim:

1. A method of forming a polymer on a substrate in a predetermined pattern comprising:

a. coating a substrate with a mixture of prepolymers which comprises (1) an ether of the oligomeric condensation product of a dihydric phenol and formaldehyde having the formula

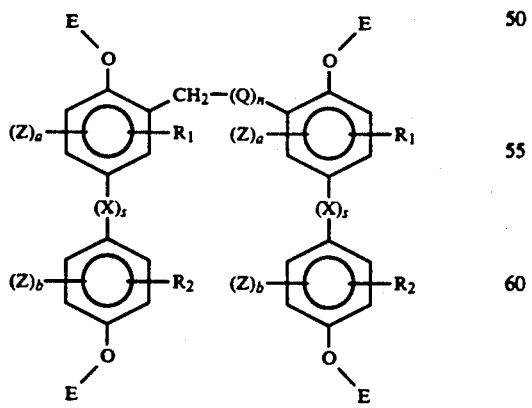

where
the recurring unit Q has the structure,

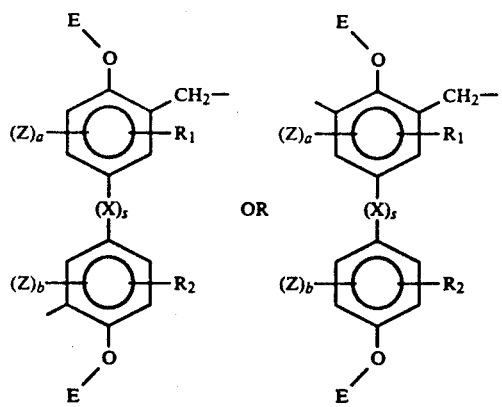

and
n is an integer from 1 to 10;
s is 1;
each X is $$\underset{|}{\overset{|}{C}}(CF_3)_2;$$

each $R_1$ and $R_2$ is independently selected from the group consisting of hydrogen, alkyl and alkoxy moieties containing to 1 to 10 carbon atoms, phenyl and phenoxy;
a and b are independently 0 or integers from 1 to 4;
Z is Cl or Br;
E is selected from the group consisting of the vinylbenzyl moiety, alkyl moieties containing 1 to 10 carbon atoms, and benzyl, subject to the constraint that at least 50% of all E's are the vinylbenzyl moiety; and (2) an ether of the oligomeric condensation product of
a. 1 molar proportion of a dialdehyde and
b. from about 3 to about 4 molar proportions of a phenol; when the dialdehyde is selected from the group consisting of $OHC(CH_2)_mCHO$, where m=0 or an integer from 1 to 6, cyclopentanedialdehyde, phthalaldehyde, isophthalaldehyde, terephthalaldehyde, hexahydrophthalaldehyde, cycloheptanedialdehyde, hexahydroisophthalaldehyde, hexahydroterephthalaldehyde, and cyclooctanedialdehyde; where the phenol has the structure $R_3C_6H_4$ and $R_3$ is hydrogen or an alkyl group containing from 1 to about 10 carbon atoms; and where the phenol residue of said oligomeric condensation product is etherified with one or more substituents to afford ether moieties randomly selected from the group consisting of vinylbenzyl, alkyl moieties containing from 1 to 10 carbon atoms, cycloalkyl moieties from 5 to 10 carbon atoms, and benzyl, with the ratio of vinylbenzyl to other moieties being from 1:1 to about 6:1;

c. irradiating the coated prepolymer of (a) through a masking pattern to selectively crosslink the portion of said coating being irradiated;

d. selectively dissolving the non-irradiated part of the prepolymer coating of (a); and e. curing the crosslinked portion of the prepolymer coating by heating at a temperature in the range of 100° C. to 300° C. for a time sufficient to further crosslink said crosslinked coating and to transform the prepolymer to an infusible glassy solid.

2. The method of claim 1 wherein Z is Br and a and b are 1-4.

3. The method of claim 1 wherein E is benzyl.

4. The method of claim 1 wherein E is at least 70% vinyl benzyl moieties and the remaining E's are propyl groups.

5. The method of claim 1 wherein n is an integer from 1 to 6.

6. The method of claim 1 wherein the number average of n is about 3.

7. The method of claim 1 where $R_3$ is hydrogen.

8. The method of claim 1 where $R_3$ is methyl.

9. The method of claim 1 wherein the ether moieties of condensation product (2) are about 70% vinyl benzyl and 30% propyl.

10. The method of claim 1 wherein the molecular weight of condensation product (2) is 400 to 6000.

11. The method of claim 1 wherein the coating of (a) is soft-baked before the irradiation of (b).

12. The method of claim 1 wherein the coating of (a) includes a photosensitizer or photoinitiator.

13. The method of claim 1 wherein the irradiation of (b) has a wavelength of 200 to 500 mn.

14. The method of claim 1 wherein $R_1$ and $R_2$ are hydrogen or alkyl with 1-10 carbon atoms.

15. The method of claim 14 wherein $R_1$ and $R_2$ are hydrogen.

16. The method of claim 14 wherein $R_1$ and $R_2$ are methyl or t-butyl moieties.

17. The method of claim 1 wherein E is an alkyl moiety having 1-10 carbon atoms.

18. The method of claim 17 wherein E is an alkyl moiety having 1-4 carbon atoms.

19. The method of claim 1 wherein E is at least 70-100% vinyl benzyl moieties and the remaining E's are alkyl with 1-10 carbon atoms.

20. The method of claim 19 wherein E is at least 95-100% vinyl benzyl moieties and the remaining E's are alkyl with 1-10 carbon atoms.

21. The method of claim 1 wherein the dialdehyde is $OHC(CH_2)_mCHO$ and m is 0 or an integer from 1 to 6.

22. The method of claim 21 wherein m is 0.

23. An electronic interconnect structure comprising the cured polymer produced by the method of claim 1.

24. An electronic interconnect structure of claim 23 wherein said cured polymer is adhered to a chromium metal layer.

* * * * *

UNITED STATES PATENT AND TRADEMARK OFFICE
CERTIFICATE OF CORRECTION

PATENT NO.   : 5,139,880
DATED        : August 18, 1992
INVENTOR(S)  : J. J. Zupancic et al.

It is certified that error appears in the above-identified patent and that said Letters Patent is hereby corrected as shown below:

Column 2, line 62:     after "(a)" insert --1--.
Column 4, line 46:     "from to 1 to" should read --from 1 to--.
Column 11, line 9-10:  after "vinyltriethoxysilane" insert --,--.
Column 12, line 8:     "25°C. With a" should read --25°C with a--.
Column 16, line 63:    after "180" insert --mL--.
Column 20, line 6:     "additional" should read --addition--.
Column 20, Table A:    "STBPAF6-F      should read --STBPAF6-F
                        STTPE"                       STTPE--
Column 25, line 26:    " (mPa s)" should read --(mPa·s)--.
Column 28, line 31:    after "containing" delete --to--.

Signed and Sealed this

Twenty-sixth Day of October, 1993

Attest:

BRUCE LEHMAN

Attesting Officer           Commissioner of Patents and Trademarks